United States Patent
Sjoestroem

(10) Patent No.: US 8,110,932 B2
(45) Date of Patent: Feb. 7, 2012

(54) SEMICONDUCTOR CIRCUIT WITH AMPLIFIER, BOND WIRES AND INDUCTANCE COMPENSATING BOND WIRE

(75) Inventor: Johan Sjoestroem, Tyresoe (SE)

(73) Assignee: Infineon Technologies AG, Neubiberg (DE)

( * ) Notice: Subject to any disclaimer, the term of this patent is extended or adjusted under 35 U.S.C. 154(b) by 776 days.

(21) Appl. No.: 11/871,735

(22) Filed: Oct. 12, 2007

(65) Prior Publication Data

US 2009/0096068 A1   Apr. 16, 2009

(51) Int. Cl.
*H01L 23/49* (2006.01)
*H01L 23/64* (2006.01)

(52) U.S. Cl. . 257/784; 257/531; 257/773; 257/E23.002; 257/E23.141

(58) Field of Classification Search ............ 257/531, 257/772, 784, 919, 923, E23.001, E23.002, 257/E23.01, E23.023, E23.024, E23.031, 257/E23.033, E23.043, E23.079, E23.141, 257/E23.143, E23.151, E23.152, E23.153, 257/E23.169, E23.175
See application file for complete search history.

(56) References Cited

U.S. PATENT DOCUMENTS

| | | | |
|---|---|---|---|
| 5,004,317 A | 4/1991 | Jackson et al. | |
| 5,973,495 A | 10/1999 | Mansfield | |
| 6,177,834 B1 | 1/2001 | Blair et al. | |
| 6,211,738 B1 | 4/2001 | Hecht | |
| 6,300,827 B1 | 10/2001 | King | |
| 6,775,901 B1 | 8/2004 | Lee et al. | |
| 6,937,115 B2 | 8/2005 | Perreault et al. | |
| 7,002,249 B2 | 2/2006 | Duffy et al. | |
| 7,304,393 B1* | 12/2007 | Greene | 257/784 |
| 2006/0220624 A1* | 10/2006 | Jiang | 323/282 |

* cited by examiner

*Primary Examiner* — Samuel Gebremariam
*Assistant Examiner* — Andrew O. Arena
(74) *Attorney, Agent, or Firm* — Slater & Matsil, L.L.P.

(57) ABSTRACT

In one embodiment of the present invention, a semiconductor circuit including an amplifier disposed on a semiconductor substrate is disclosed. A first bond wire coupled to an input of the amplifier, a second bond wire coupled to an output of the amplifier, and a third bond wire coupled in series with the first bond wire. A third bond wire is disposed on the semiconductor substrate so that a mutual inductance between the second bond wire and the third bond wire at least partially cancels a mutual inductance between the first bond wire and the second bond wire.

17 Claims, 3 Drawing Sheets

SEMICONDUCTOR CIRCUIT WITH AMPLIFIER, BOND WIRES AND INDUCTANCE COMPENSATING BOND WIRE

TECHNICAL FIELD

This invention relates generally to semiconductor devices and methods, and more particularly to devices and methods for stabilizing semiconductor amplifiers.

BACKGROUND

Semiconductor devices are used in a large number of electronic devices, such as computers, cell phones and others. One of the goals of the semiconductor industry is to improve the performance and reduce the cost of use and acquisition of high power devices used in power transmission applications such as cellular base-station transmitters and cable-TV transmitters.

Reducing the cost and increasing the performance of power amplifier based transmitter devices can be done in a number of ways. One way to reduce cost is to increase the amount of integration present on integrated circuits. Increasing integration reduces the number of components required for purchase, reduces the amount of board space required for a particular design, and reduces the amount of labor required to test and calibrate a particular amplifier design, if necessary. Another way to reduce the cost of a power transmitter product is to incorporate features that reduce the difficulty of product design and enhance the reliability of the design.

To give one of many examples, in the field of transmitter circuits one of the most challenging aspects of designing a transmitter is optimizing the amplifier to provide acceptable gain, output match, and stability. This optimization is typically performed by adjusting external matching components. In some cases, hand tuning is required in order for these devices to have optimal performance. Hand tuning and adjustment, however, add cost to the system, and can pose support and maintenance problems if the transmitter loses calibration and adjustment in the field.

One technique that can increase the reliability and ease of use of matching networks is to create matching networks which are comprised of on-chip bond wires which reside within the package. If a matching network is included inside the integrated circuit package, performance degradation due to output matching network due to part-to-part component mismatch can be avoided, potentially yielding better signal balance and less spurious emissions.

Another challenge is providing unconditionally stable devices. An unconditionally stable device, in terms of s-parameters, provides the benefit that the device will be stable under any source or load impedance. Unconditionally stable devices are easier to design in a transmitter system and are more reliable.

One difficulty with providing an unconditionally stable device is dealing with the effect of mutual inductance between bond wires. For example, mutual inductance between input and output bond wires, or mutual inductance between the input and on-chip matching network bond wires, can provide an unwanted feedback path that destabilizes the amplifier. The effect of mutual inductance feedback becomes more pronounced at high gains, however, and can render the design of a high gain amplifier more challenging.

A number of available techniques can be used to create an unconditionally stable amplifier. One method is to include a passive loss within the amplifier. While adding a passive loss can make an amplifier unconditionally stable, the passive loss will lower the power efficiency and lower the maximum achievable gain of the amplifier. Lower amplifier gains add cost to a system because more stages of amplification, hence more components, are required for a particular gain. As more amplifier stages are added, maintaining performance, such as high linearity, becomes more challenging.

SUMMARY OF THE INVENTION

In one embodiment of the present invention, a semiconductor circuit including an amplifier is disposed on a semiconductor substrate. A first bond wire is coupled to an input of the amplifier, a second bond wire is coupled to an output of the amplifier, and a third bond wire is coupled in series with the first bond wire. A third bond wire is disposed on the semiconductor substrate so that a mutual inductance between the second bond wire and the third bond wire at least partially cancels a mutual inductance between the first bond wire and the second bond wire.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to embodiments in a specific context, namely a system and method for stabilizing a semiconductor amplifier. Concepts of the invention can also be applied, however, to other electronic devices, such as discrete amplifiers, or to other circuits whose performance is affected by mutual inductance between bond wires or signal leads.

Figure 1A:
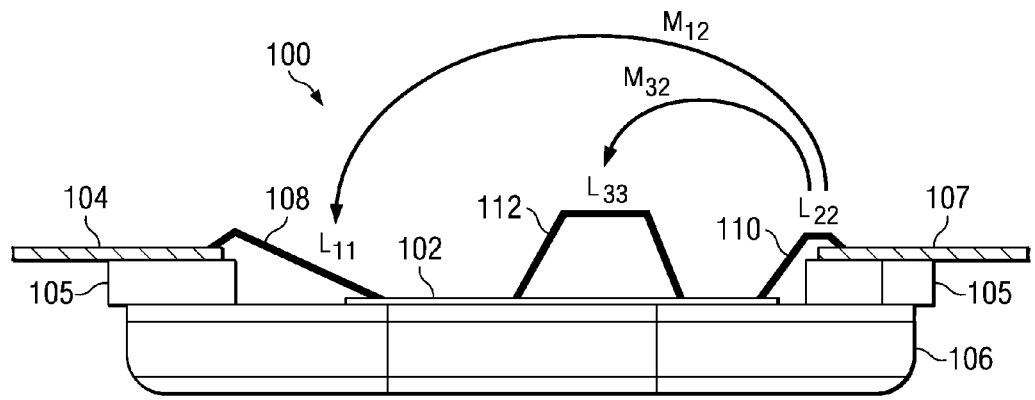
FIGS. 1a-1c illustrate bonding diagrams and schematics of an embodiment amplifier circuit.

FIG. 1a illustrates a cross-section of an integrated circuit assembly 100. In an embodiment of the present invention, integrated circuit 102 is mounted on a conductive package heat slug 106, on which lead frame 105 is mounted. Package leads 104 and 107 provide landings for input bond wire 108 and output bond wire 110. In embodiments, integrated circuit 102 contains an amplifier whose input is coupled to input bond wire 108 and whose output is coupled to output bond wire 110. Other circuits may be included on integrated circuit 102 that are either related to the amplifier, such as bias generators, or are related to other functions such as mixers or oscillators. Embodiments of the present invention include compensating bond wire 112 bonded to integrated circuit 102 to compensate for the effect of mutual inductance from the output bond wire 110 to the input bond wire 108. Conventional embodiments, however, do not include compensating bond wire 112.

Figure 1B:
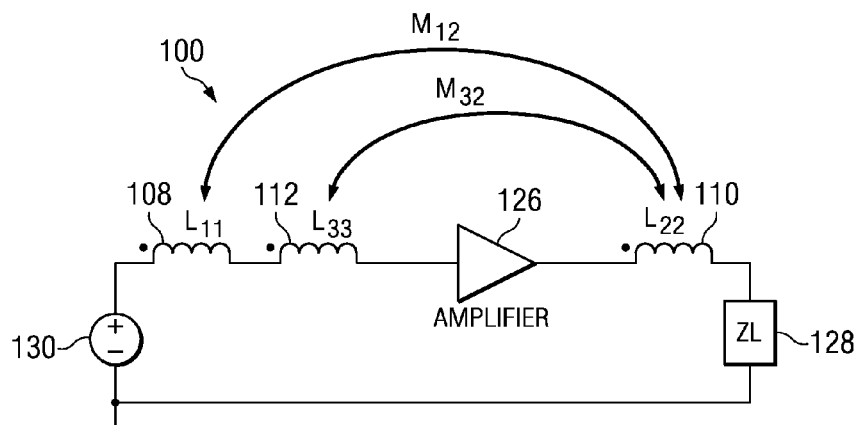

FIG. 1b shows a schematic representation of an embodiment of the present invention illustrating both connectivity and magnetic coupling issues. Input bond wire 108 is represented as inductance $L_{11}$, output bond wire 110 is represented as inductance $L_{22}$, and compensating bond wire 112 is represented as inductance $L_{33}$. These inductances can also include effects of current return paths in the conductive heat slug 106 (see FIG. 1a), acting as a ground plane. Mutual inductance from output bond wire 110 to input bond wire 108 is modeled as mutual inductance $M_{12}$, and mutual inductance from output bond wire 110 to compensating bond wire 112 is modeled as mutual inductance $M_{32}$. In embodiments of the present invention, compensating bond wire 112 is routed in series with input bond wire 108. In alternative embodiments, however, the placement of compensating bond wire occurs in other places within the circuit topology, for example, in series or in shunt with other components, or within amplifier 126 itself.

Signal source 130 is coupled to amplifier 126 through input bond wire 108, and signal load 128 is coupled to the output of amplifier 126 through output bond wire 110. Signal source 130 is representative of the signal input to amplifier 126, which can include, for example, a test signal generator, an output of a prior stage of amplification within a system, or any other source of signal input depending on the application. In embodiments of the present invention, signal source 130 has a defined impedance at a range of signal frequencies amplified by amplifier 126. In some embodiments of the present invention, amplifier 126 may require an external input matching network (not shown). Signal load 128 is representative of any load which can include, for example, a test load, an antenna, or a transmission line. In embodiments of the present invention, signal load 128 has a defined impedance $Z_L$, which, in some embodiments, requires an output matching network (not shown) at the output of amplifier 126.

Amplifier 126 may be targeted toward a variety of applications. For example among other applications, amplifier 126 may be targeted toward use in cellular base-stations, and its specifications are determined accordingly. Cellular base-stations typically require a high power output. For example, in GSM systems, some cellular base-station amplifiers are required to produce an output of 80 W at a frequency of about 920-960 MHz. In embodiments of the present invention, amplifier 126 preferably has a gain of 30 dB, a maximum peak output power of 80 W, and operates with a 28 V supply voltage. Because of the high gain and output power requirements, mutual inductance $M_{12}$ between input bond wire 108 and output bond wire 110 can create an unwanted feedback path and cause stability issues. Compensating bond wire 112 represented by inductance $L_{33}$ can effectively null mutual inductance $M_{12}$ by introducing its own mutual inductance $M_{32}$.

The inductances shown in FIG. 1b can be represented as an inductance matrix as shown in Equation 1. Inductances $L_{11}$, $L_{22}$ and $L_{33}$ form the diagonal elements of the matrix, and mutual inductances $M_{12}$, $M_{13}$, $M_{21}$, $M_{23}$, $M_{31}$ and $M_{32}$ form the off-diagonal elements. Off-diagonal elements with the same indices are assumed to be equal. For example, $M_{12}$ is equal to $M_{21}$, $M_{13}$ is equal to $M_{31}$, and $M_{23}$ is equal to $M_{32}$. Equation 1 shows that the product of the inductance matrix with the first derivative of a current vector equals a voltage vector. The derivative current vector, represented in the s-domain, is the first derivative of the current through each inductor. For example, $sI_1(s)$ is the first derivative of the current through $L_{11}$, and $V_1(s)$ is the voltage across inductor $L_{11}$, $$\begin{bmatrix} L_{11} & M_{12} & M_{13} \\ M_{21} & L_{22} & M_{23} \\ M_{31} & M_{32} & L_{33} \end{bmatrix} \begin{bmatrix} sI_1(s) \\ sI_2(s) \\ sI_3(s) \end{bmatrix} = \begin{bmatrix} V_1(s) \\ V_2(s) \\ V_3(s) \end{bmatrix} \quad \text{Equation 1}$$

According to an embodiment of the present invention, the physical length and position of compensating bond wire 112 is chosen such that the mutual inductance from $L_{22}$ to $L_{33}$, $M_{32}$, is approximately equal and opposite of mutual inductance $M_{12}$ from $L_{22}$ to $L_{11}$. By making mutual inductance $M_{32}$ approximately equal in magnitude to mutual inductance $M_{12}$, the effect of current running through inductance $L_{22}$ on the input voltage at the input of amplifier 126 may be minimized. Assuming that current $I_1(s)$ through input bond wire 108 is equal to current $I_3(s)$ through compensating bond wire 112, the voltage across the series combination of $L_{11}$ and $L_{33}$ can be represented as shown in equation 2.

$$V_1(s)+V_3(s)=s(L_{11}+L_{33}+M_{13}+M_{31})I_1(s)+s(M_{12}+M_{32})I_2(s) \quad \text{Equation 2}$$

In order to minimize the effect of current $I_2(s)$ though the output bond wire 112, $M_{32}$ may have equal magnitude and opposite sign of $M_{12}$ so that $M_{32}=-M_{12}$.

Compensating bond wire 112 can be positioned in a number of ways in order to achieve the correct compensating mutual inductance, $M_{32}=-M_{12}$. For example, the physical position of $L_{33}$ on integrated circuit 102 with respect to input bond wire 108 and output bond wire 110 can be adjusted, and the physical shape of compensating bond wire 112 can be modified. Typically, compensating bond wire 112 is positioned so that it is oriented in the same horizontal direction as input bond wire 108 and output bond wire 110. In alternative embodiments, however, compensating bond wire 112 can be positioned off axis from input and output bond wires 108 and 110.

Figure 1C:
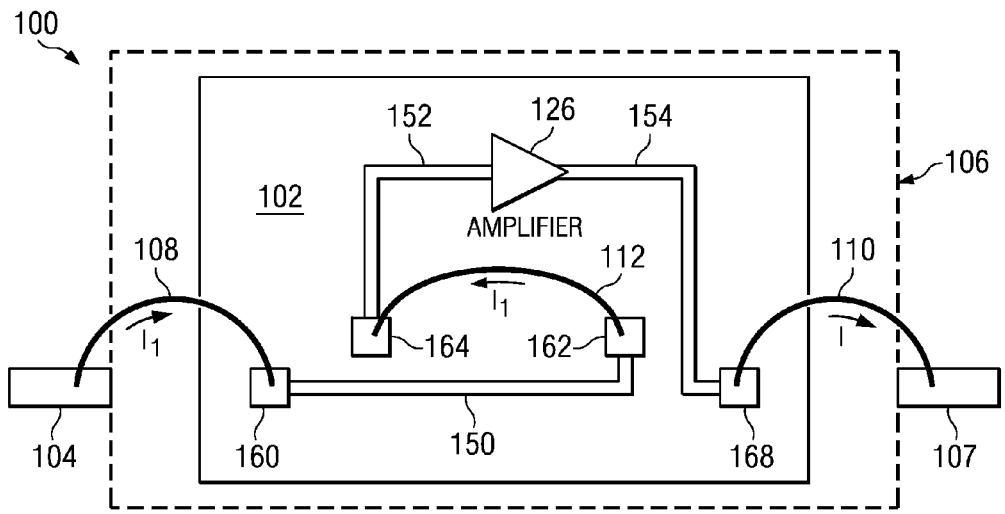

Turning to FIG. 1c, an illustration showing the relative position of compensating bond wire 112 is shown. Input bond wire 108 is bonded to landing 104 on the lead frame (not shown) and to input bond pad 160 disposed on integrated circuit 102. Similarly, output bond wire 110 is bonded to landing 107 and to output bond pad 168. An on-chip signal trace 150 routes the signal from input bond wire 108 to bond pad 162. Compensating bond wire 112 is routed from bond pad 162 to bond pad 164 positioned in the opposite direction from input bond wire 108. Bond pad 164 is coupled to the input of amplifier 126 though signal trace 152, and amplifier 126 is routed to output bond wire 110 through signal trace 154.

Signal traces 150, 152 and 154, and bond pads 162 and 164 can be implemented by using metallization layers that are a part of the semiconductor process, or they can be implemented using a redistribution layer.

As can be seen in FIG. 1c, the direction of $I_1$ flowing through input bond wire 108 is opposite in direction to current $I_1$ flowing through compensating bond wire 112. Because the system 100 is physically oriented so that current $I_1$ flows in an opposite direction through input bond wire 108 and compensating bond wire 112, the mutual inductance from output bond wire 110 to input bond wire 108 will have an opposite sign of the mutual inductance from output bond wire 110 to compensating bond wire 112. The physical orientations of the bond wires do not generally correspond with the intuitive sign of the mutual inductance between the inductances representing the bond wires, especially if the inductances represented by $L_{11}$, $L_{22}$, and $L_{33}$ also include current return paths through a ground plane 106. For example, if the opposite sign of $M_{32}$ is desired, the circuit connections to the terminals of bond wire 112 at bond pads 162 and 164 can be interchanged.

Figure 2A:
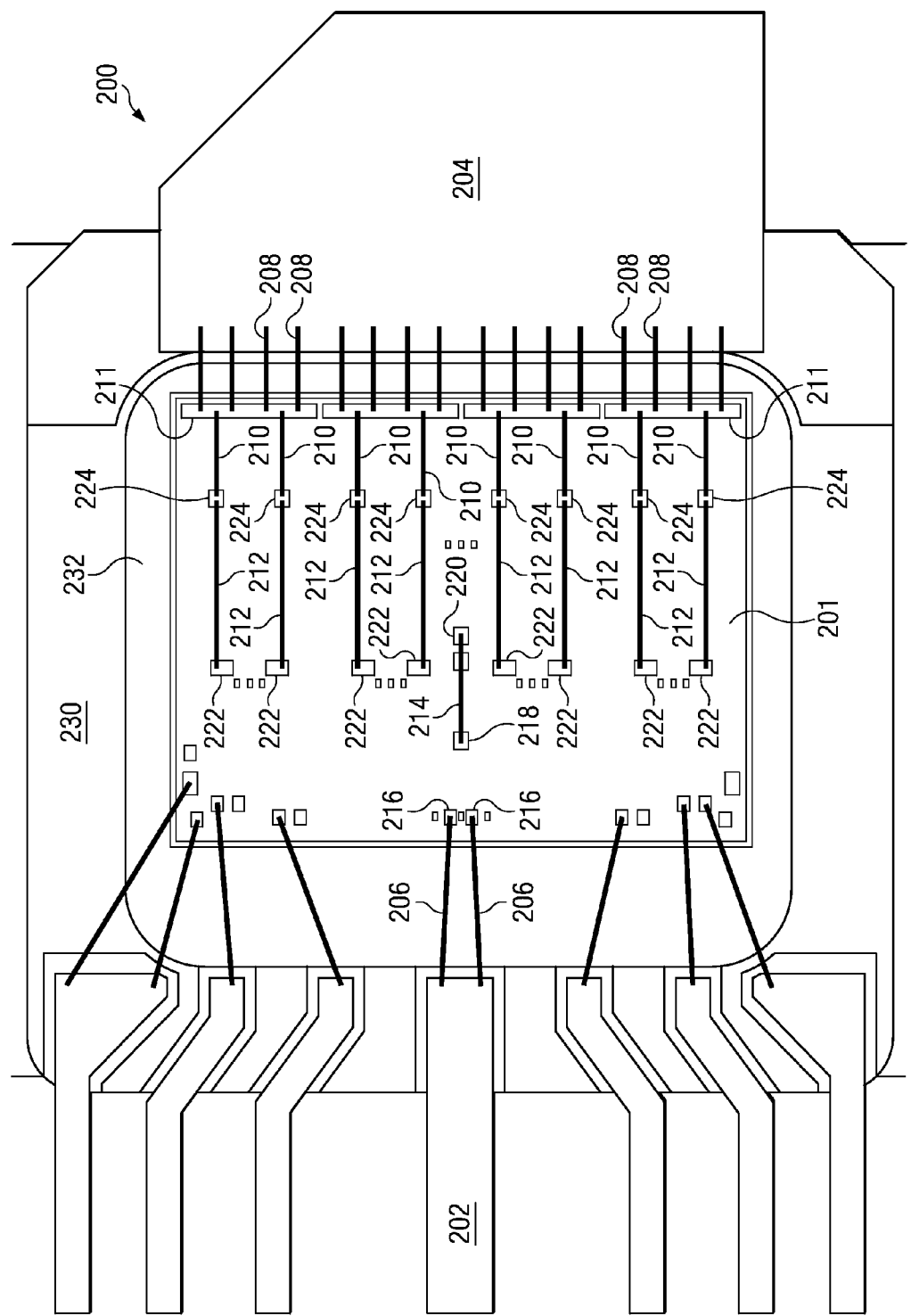
FIGS. 2a-2c illustrate bonding diagrams and schematics of another embodiment amplifier circuit.

A bonding diagram 200 of another embodiment of the present invention is shown in FIG. 2a. In embodiments of the present invention, integrated circuit 201 contains an RF amplifier (not shown). Input bond wires 206 are bonded to landing 202 on one side and to bond pads 216 on the other side to provide an input signal to the on-chip RF amplifier. Conductive heat slug 232 acts as a ground plane. In this embodiment, input bond wires 206 include two parallel bond wires. Multiple bond wires are desirable because the parallel combination of the two input bond wires 206 can have a lower equivalent inductance than a single bond wire. Similarly, output bond wires 208 are bonded on one side to landing 204 disposed on lead frame 230, and to bond pads 211 on the other side. Again, output bond wires 208 include multiple bond wires. Multiple bond wires are typically used at the output of RF power amplifiers to handle large output currents. Multiple bond wires are also advantageous because they reduce the length of on-chip routing required to connect on-chip routing to the bond pads 211, especially if the on-chip amplifier is distributed along the length of integrated circuit 201.

In addition to input bond wires 206 and output bond wires 208, other bond wires are attached to the surface of integrated circuit 201 in embodiments of the present invention. Bond wires 210 and 212 are used as inductive elements for an on-chip output matching network. Output matching network bond wire 212 is attached to bond pads 222 and 224, and output matching bond wire 210 is bonded to bond pads 224 and output bond pad 211. Similar to other embodiments described hereinabove, compensating bond wire 214 is bonded to bond pads 218 and 220. Compensating bond wire 214, in this case, compensates for the mutual inductance from bond wires 212 from the output matching network to input bond wires 206. In this embodiment, compensating bond wire 214 is oriented in the same direction as output matching bond wires 210 and 212, input bond wires 206, and output bond wires 208. A portion of compensating bond wire 214 also runs parallel to matching bond wires 212 over a portion of its length.

Figure 2B:
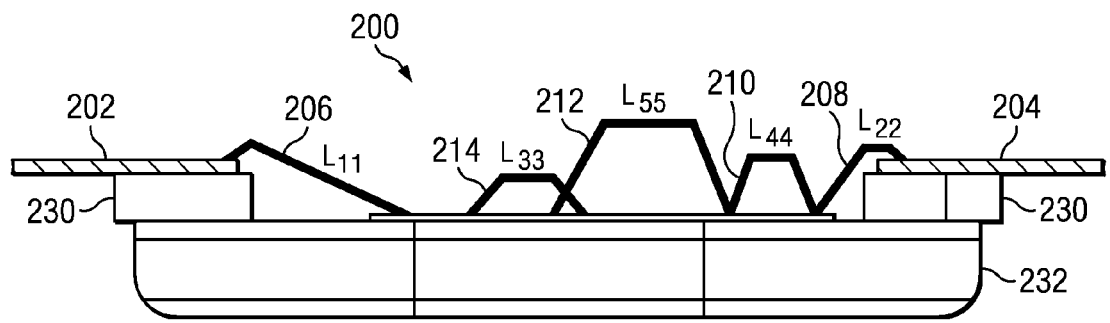

FIG. 2b illustrates the relative horizontal position of bond wires 206, 208, 210, 212 and 214. As is shown by FIG. 2b, the relative heights of these bond wires can vary from bond wire to bond wire. For example, bond wire 212 is longer and higher than output matching bond wire 210 and compensating bond wire 214. In an embodiment of the present invention, bond wire 212 is longer and higher than the other bond wires in order to provide a larger inductance for the output matching network for this particular component. It should be noted that the relative lengths and heights of the bond wires shown in FIG. 2b can be a result of an optimization process, and that other embodiments may have bond wires with heights and widths different from the heights and widths shown.

During optimization, both the performance of the compensating bond wire 214 and the performance of the output matching network can be optimized simultaneously. The location of compensating bond wire 214 as well as matching network bond wires 210 and 212 can be adjusted by fabricating new masks to locate these pads. The layers required for the top level routing can either be top layer metal layers that are used in the fabrication of integrated circuit 201, or a redistribution layer can be modified using techniques as known in the art. Once the pads are located or the locations of the pads have been fixed the bond wire and the bond wire height and length can be trimmed and modified in order to fine-tune the performance of amplifier system 200.

Figure 2C:
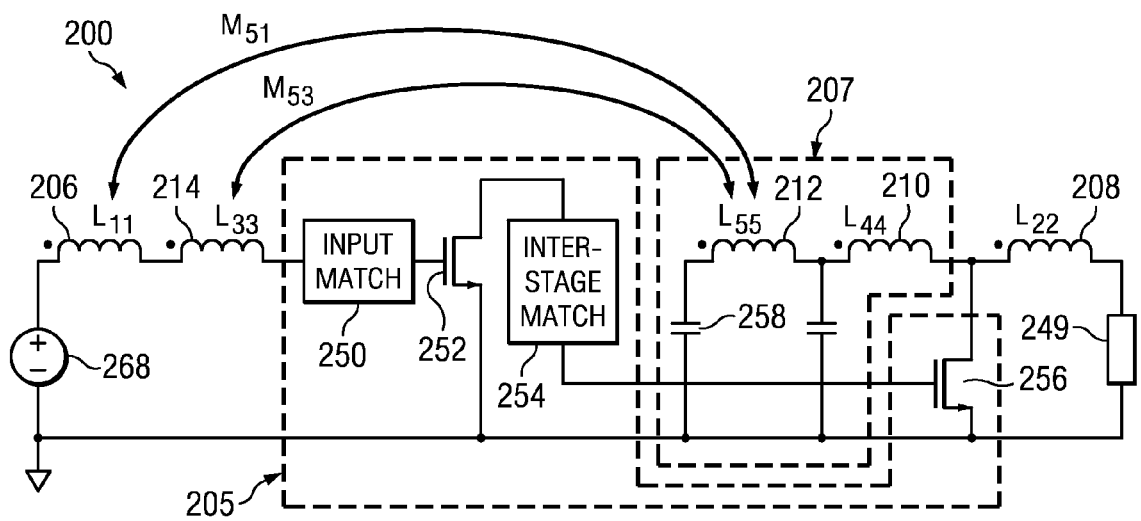

FIG. 2c shows a schematic representation of the system 200. In an embodiment of the present invention, amplifier 205 is implemented as a two-stage amplifier including an input matching network 250, first stage transistor 252, inter-stage match 254, and output transistor 256. A signal source 268 drives amplifier 205, and amplifier 205 drives external load 249. Signal source 268 represents an external signal source such as another system component or a test signal generator. Load 249 represents any external load. In embodiment applications, load 249 may be an antenna, a cable transmission system, a test load, or a system component such as another amplification stage. An internal matching network 207 is included to match the output of amplifier 205 to load 249. In embodiments, matching network 207 is implemented on-chip.

First stage transistor 252 and output transistor 256 are typically LDMOS transistors. Input match 250 and inter-stage match 254 are typically comprised of passive devices. Input match 250 matches source 268 with input transistor 252. Inter-stage match 254 provides an impedance match from the drain of input transistor 252 to the gate of output stage transistor 256. Input matching network 250 and inter-stage matching network 254 are designed according to conventional techniques known in the art. These matching networks can be optimized for noise, gain, linearity, input matching, or any other parametric trade-off required by a particular application. In alternative embodiments of the present invention, other amplifier topologies besides the amplifier topology shown in FIG. 2c may be used. A single stage amplifier may be used or a multiple stage amplifier may be used. Amplifiers with more complex topologies may also be used. Additionally, other device types besides field effect transistors may be used, for example BJTs.

Input bond wire 206 is represented by inductance $L_{11}$, output bond wire 208 is represented by inductance $L_{22}$, compensating bond wire 214 is represented by inductance $L_{33}$, and matching network bond wires 210 and 212 are represented by inductances $L_{44}$ and $L_{55}$ respectively. In some embodiments of the present invention, these inductances may also include effects of current return paths in the conductive heat slug 232, acting as a ground plane. A dominant contributor to instability is the mutual inductance $M_{51}$ from matching network inductor $L_{55}$ and input bond wire $L_{11}$. In embodiments of the present invention, compensating inductor $L_{33}$ is positioned so that $M_{51}=-M_{53}$. Equation 3 shows the inductance matrix and its relationship to the voltages across and currents through the inductors for the embodiment shown in FIG. 2c.

$$\begin{bmatrix} L_{11} & M_{12} & M_{13} & M_{14} & M_{15} \\ M_{21} & L_{22} & M_{23} & M_{24} & M_{25} \\ M_{31} & M_{32} & L_{33} & M_{34} & M_{35} \\ M_{41} & M_{42} & M_{43} & L_{44} & M_{45} \\ M_{51} & M_{52} & M_{53} & M_{54} & L_{55} \end{bmatrix} \begin{bmatrix} sI_1(s) \\ sI_2(s) \\ sI_3(s) \\ sI_4(s) \\ sI_5(s) \end{bmatrix} = \begin{bmatrix} V_1(s) \\ V_2(s) \\ V_3(s) \\ V_4(s) \\ V_5(s) \end{bmatrix} \quad \text{Equation 3}$$

Similar to the embodiment shown in FIG. 1b and described in Equation 1, each diagonal element in the inductance matrix of Equation 3 represents one of the five inductors shown in FIG. 2c. Each off-diagonal term represents a mutual inductance, for example, $M_{53}$ represents the mutual inductance between $L_{55}$ and $L_{33}$. Pairs of off-diagonal terms are assumed to be equal, for example $M_{53}=M_{35}$. Equation 4 is an expression for the sum of voltages across the series combination of input bond wire 206 and compensating bond wire 214 represented by $L_{11}$ and $L_{33}$. For the sake of illustration, current $I_1(s)$ flowing through $L_{11}$ is assumed to be equal to current $I_3(s)$ flowing though $L_{33}$.

$$V_1(s) + V_3(s) = s(L_{11} + L_{33} + M_{13} + M_{31})I_1(s) + \quad \text{Equation 4}$$
$$s(M_{12} + M_{32})I_2(s) +$$
$$s(M_{14} + M_{34})I_4(s) +$$
$$s(M_{15} + M_{35})I_5(s)$$

As can be seen from Equation 4, the effect of the mutual inductance between $L_{55}$ and $L_{11}$ can be eliminated if $M_{15}=-M_{35}$. In many embodiments of the present invention, setting $M_{15}=-M_{35}$ is sufficient to overcome the effects of unwanted feedback due to mutual inductance because of the dominance of $M_{15}$ in coupling the output to the input. It can be seen, however, that mutual inductances $M_{12}$ and $M_{14}$ can also contribute feedback via mutual coupling.

While nulling the effects of $M_{15}$ is sufficient for embodiments, the effects of $M_{12}$ and $M_{14}$ may also be eliminated in alternative embodiments of the present invention through optimization. In fact, other embodiments of the present invention may have other dominant contributors of mutual inductance that may affect the stability of the circuit. Depending on the circuit's topology, optimization of the bond wire positions may be performed to minimize mutual coupling over some or all of the off-diagonal components shown in Equation 3. In yet other embodiments of the present invention, more than five, or less than five, inductive elements may be present or may need to be optimized. It should be noted that the embodiments described herein are illustrative and are not meant to limit the invention to particular topologies.

Output matching network 207 includes bond wire inductances $L_{44}$ and $L_{55}$, and capacitors 258 and 260. In an embodiment of the present invention, $L_{44}$ is typically about 0.15 nH, and $L_{55}$ is 0.4 nH. These inductances correspond to bond wire lengths of 1 mm and 2 mm respectively. Capacitor 260 is typically about 30 pF. Capacitors 258 and 260 are constructed as conventional on-chip capacitors, and may be constructed of two metal layers or as sinker capacitors, available in conventional LDMOS processes.

Inductance $L_{55}$, which corresponds to bond wire 212, can potentially destabilize amplifier circuit 200, especially if the gain of the amplifier is high, for example 25 dB or greater. The physical lengths and positioning of matching network bond wires 210 and 212 represented by $L_{55}$ and $L_{44}$ as well as compensating bond wire 214 represented by $L_{33}$ can be optimized so that the magnitudes of $M_{51}$ and $M_{53}$ are approximately equal and opposite so that the effects of mutual inductance on the input is minimized.

In embodiments of the present invention, compensating inductance $L_{33}$ is placed in series with input bond wire 206 represented by $L_{11}$. In alternative embodiments of the present invention, however, compensating inductance $L_{33}$ may be placed in other portions of the circuit besides being placed in series with the input bond wire 206. For example, compensating inductance $L_{33}$ could be placed in shunt with other components in the amplifier circuit, or in series with other components in amplifier circuit 200.

Figure 3:
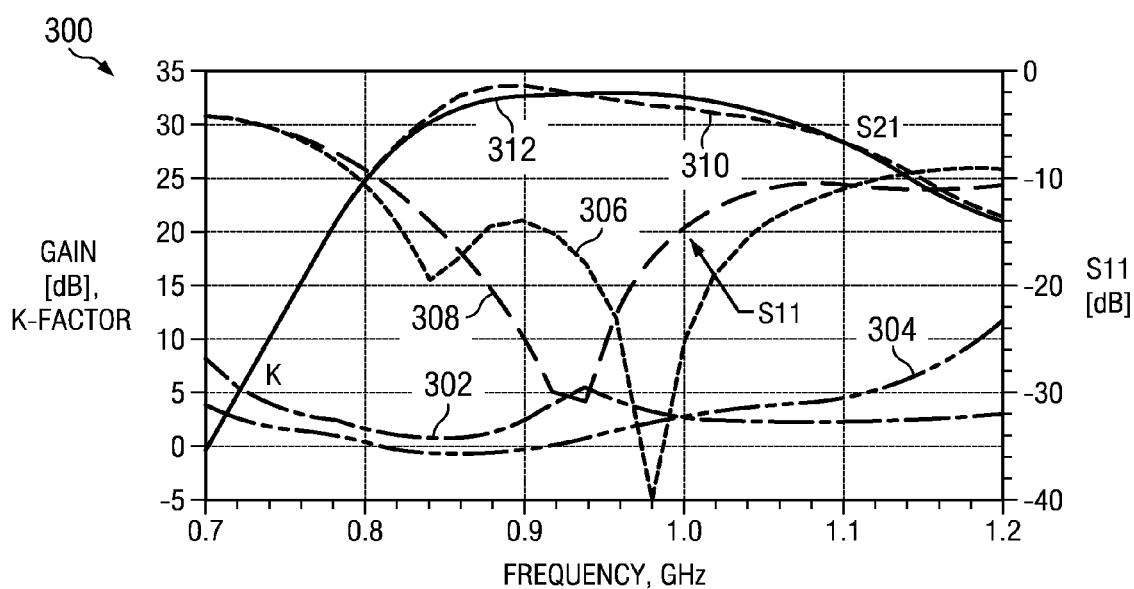
FIG. 3 illustrates an RF performance graph of an embodiment of the present invention.

Turning to FIG. 3, a graph 300 of the relative performance of amplifier circuit 200 is shown with and without compensating bond wire 214. In order for the amplifier to be unconditionally stable, the Rollett stability factor K must be greater than one. As can be seen by FIG. 3, trace 304, representing stability factor K for circuit 200 with $L_{33}$ shorted, dips below one in regions between 800 MHz and 900 MHz, thereby showing that amplifier circuit 200 is not unconditionally stable. In this example, the minimum stability factor K is 0.95 at 840 MHz for curve 304. Curve 302, on the other hand, represents the stability factor K for the amplifier circuit 200 with inductor $L_{33}$ included. In this case, curve 302 indicates that amplifier circuit 200 is unconditionally stable. Of course, these results will vary according to the application, and may vary with respect to other embodiments of the present invention.

Traces 310 and 312 represent the gain of the amplifier. Curve 310 is the gain of the amplifier without the effect of compensating bond wire 214 represented by inductor $L_{33}$, and curve 312 is the gain of the amplifier with the effect of compensating bond wire 214 included. The maximum gain of the amplifier both with and without the compensating bond wire 214 represented by inductor $L_{33}$ is between 30 and 35 dB, indicating that the gain of the amplifier is not adversely affected by compensating bond wire 214.

Curves 306 and 308 represent the input return loss $S_{11}$ of amplifier circuit 200 shown in FIGS. 2a to 2c. Curve 306 represents the return loss of the amplifier circuit 200 without the effect of compensating inductor $L_{33}$ and curve 308 represents the input return loss of amplifier circuit 200 with the effect of compensating bond wire 214 represented by inductor $L_{33}$ (FIG. 2c). As can be seen, curve 308 provides a return loss of better than −20 dB between 880 MHz and 970 MHz. Therefore, in embodiments of the present invention, compensating bond wire 214 represented by inductance $L_{33}$ does not degrade gain and does not appreciably degrade input return loss $S_{11}$.

Determining the length and location of compensating bond wire 214 and matching bond wires 212 and 210 can be performed in a number of ways. In an embodiment of the present invention, locations and lengths of these bond wires can be modeled and optimized using common simulators. The location and lengths of these bond wires can be optimized within these simulators either using hand optimization techniques, or a systematic optimization algorithm known in the art. For example, an LMS algorithm can be used to simultaneously optimize the performance of circuit 200's stability and output match. In some embodiments, however, stability may be optimized with a deterministic rather than an iterative solution.

In an alternative embodiment of the present invention, the performance of circuit 200 can be optimized by adjusting the length and orientation of the bond wires by hand in a laboratory until acceptable performance is achieved. In some embodiments of the present invention, the location and position of compensating bond wire 214 may be calculated only to cancel the effects of mutual inductance from $L_{55}$ to $L_{33}$, in which case the calculation may be amenable to hand calculation.

In other embodiments of the present invention, optimization of the bond wire inductances may be performed in conjunction with electrical models of amplifier 205. For example, if a circuit simulator is used, the performance of amplifier 205 can be simulated along with the effects of all of the bond wire inductances. In other embodiments of the present invention, it may be sufficient to optimize only the compensating bond wire position to account for only the most dominant mutual inductance, for example $M_{15}$ from Equation 3. Optimizing the compensating bond wire position to account for only the most dominant inductance may be used, for example, in embodiments with simple circuit topologies.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A semiconductor circuit comprising:
   an amplifier disposed on a semiconductor substrate;
   a first bond wire coupled to an input of the amplifier;
   a second bond wire coupled to an output of the amplifier; and
   a third bond wire coupled in series with the first bond wire, wherein a mutual inductance between the second bond wire and the third bond wire at least partially cancels a mutual inductance between the first bond wire and the second bond wire, wherein a first end of the third bond wire is bonded to a first bonding pad disposed on the semiconductor substrate, and a second end of the third bond wire is bonded to a second bonding pad disposed on the semiconductor substrate.

2. The semiconductor circuit of claim 1, wherein a first end of the first bond wire is coupled to a lead frame.

3. The semiconductor circuit of claim 2, wherein a first end of the second bond wire is coupled to the lead frame.

4. The semiconductor circuit of claim 1, wherein the first bond wire is oriented in a first direction and the third bond wire is oriented in a second direction, the second direction being opposite to the first direction.

5. The semiconductor circuit of claim 4, wherein at least a portion of the first bond wire is adjacent to the second bond wire.

6. The semiconductor circuit of claim 1, further comprising a fourth bond wire coupled to the output of the amplifier.

7. The semiconductor circuit of claim 6, wherein a first end of the fourth bond wire is coupled to a lead frame, and wherein a first end and a second end of the second bond wire are coupled to bond pads disposed on the semiconductor substrate.

8. The semiconductor circuit of claim 7, further comprising an output matching network, wherein the output matching network comprises the second bond wire.

9. The semiconductor circuit of claim 1, wherein the third bond wire further cancels an other mutual inductance present within the semiconductor circuit.

10. The semiconductor circuit of claim 1, wherein the amplifier comprises a gain of at least 20 dB.

11. A semiconductor circuit comprising:
    an amplifier disposed on a semiconductor substrate;
    an input bond wire comprising a first end and a second end, the first end coupled to a lead frame, and the second end coupled to an input of the amplifier;
    an output bond wire comprising a first end and a second end, the first end coupled to the lead frame, and the second end coupled to an output of the amplifier;
    a matching network comprising a matching bond wire coupled to the output of the amplifier, wherein the matching bond wire presents a mutual inductance to the input bond wire; and
    a compensating bond wire coupled in series with the input bond wire to the input of the amplifier, wherein the compensating bond wire presents a mutual inductance to the matching bond wire with a polarity opposite the mutual inductance between the matching bond wire and the input bond wire, the compensating bond wire comprising a first end affixed to a first bonding pad disposed on the semiconductor substrate, and a second end affixed to a second bonding pad disposed on the semiconductor substrate.

12. The semiconductor circuit of claim 11, wherein the matching bond wire comprises a first end affixed to a third bonding pad disposed on the semiconductor substrate, and a second end affixed to a fourth bonding pad disposed on the semiconductor substrate.

13. The semiconductor circuit of claim 12, wherein lengths and bonding pad positions of the matching bond wire and the compensating bond wire are optimized to provide an output match and a stable amplifier.

14. The semiconductor circuit of claim 11, wherein the matching network comprises a plurality of matching bond wires.

15. The semiconductor circuit of claim 11, further comprising at least one further compensating bond wire.

16. A semiconductor circuit comprising:
    an amplifier disposed on a semiconductor substrate;
    a first bond wire coupled to an input of the amplifier;
    a second bond wire coupled to an output of the amplifier, wherein the second bond wire comprises a first end coupled to a first bonding pad disposed on the semiconductor substrate and a second end coupled to a second bonding pad disposed on the semiconductor substrate;
    a third bond wire coupled in series with the first bond wire, wherein a mutual inductance between the second bond wire and the third bond wire at least partially cancels a mutual inductance between the first bond wire and the second bond wire; and
    a fourth bond wire comprising a first end coupled to a lead frame.

17. The semiconductor circuit of claim 16, further comprising an output matching network, wherein the output matching network comprises the second bond wire.

* * * * *